US009634030B2

(12) United States Patent
Ye

(10) Patent No.: US 9,634,030 B2
(45) Date of Patent: Apr. 25, 2017

(54) ARRAY SUBSTRATE AND MANUFACTURING METHOD THEREOF

(71) Applicant: SHENZHEN CHINA STAR OPTOELECTRONICS TECHNOLOGY CO., LTD., Shenzhen, Guangdong (CN)

(72) Inventor: Chengliang Ye, Guangdong (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 8 days.

(21) Appl. No.: 14/771,042

(22) PCT Filed: Jul. 20, 2015

(86) PCT No.: PCT/CN2015/084425
§ 371 (c)(1),
(2) Date: Aug. 27, 2015

(87) PCT Pub. No.: WO2017/008318
PCT Pub. Date: Jan. 19, 2017

(65) Prior Publication Data
US 2017/0010492 A1    Jan. 12, 2017

(30) Foreign Application Priority Data
Jul. 10, 2015   (CN) .......................... 2015 1 0406092

(51) Int. Cl.
*H01L 27/12*       (2006.01)
*G02F 1/1362*      (2006.01)

(52) U.S. Cl.
CPC .... *H01L 27/1222* (2013.01); *G02F 1/136209* (2013.01); *H01L 27/124* (2013.01); *H01L 27/1259* (2013.01); *G02F 2001/136222* (2013.01)

(58) Field of Classification Search
CPC ................................... G02F 1/136209
See application file for complete search history.

(56) References Cited

U.S. PATENT DOCUMENTS

| 5,501,900 | A | * | 3/1996 | Harada | G02B 5/201 428/1.6 |
| 5,615,030 | A | * | 3/1997 | Harada | G02B 5/201 349/110 |
| 5,926,702 | A | * | 7/1999 | Kwon | G02F 1/136209 349/106 |
| 6,429,916 | B1 | * | 8/2002 | Nakata | G02F 1/136227 349/106 |
| 6,532,050 | B1 | * | 3/2003 | Kim | G02F 1/133514 349/106 |
| 6,559,595 | B1 | * | 5/2003 | Inoue | G02F 1/133345 313/506 |

(Continued)

*Primary Examiner* — Evan Pert
(74) *Attorney, Agent, or Firm* — Ladas & Parry LLP

(57) ABSTRACT

An array substrate and a manufacturing method thereof are provided. The method has steps of: forming a black matrix layer having a plurality of black matrixes on a substrate; forming a switch array layer having a plurality of thin-film transistors on the black matrix layer; forming a color resist layer having a plurality of color resists on the switch array layer; and forming a transparent conductive layer on the color resist layer.

17 Claims, 3 Drawing Sheets

(56) References Cited

U.S. PATENT DOCUMENTS

| | | | | |
|---|---|---|---|---|
| 6,597,415 B2* | 7/2003 | Rho | ................ | G02F 1/133345 |
| | | | | 257/59 |
| 6,597,420 B2* | 7/2003 | Kim | ................ | G02F 1/133512 |
| | | | | 349/106 |
| 6,897,927 B2* | 5/2005 | Tanaka | ............. | G02F 1/136209 |
| | | | | 349/113 |
| 7,098,970 B2* | 8/2006 | Hidehira | .......... | G02F 1/136227 |
| | | | | 349/139 |
| 7,440,041 B2* | 10/2008 | Chang | ............ | G02F 1/133516 |
| | | | | 257/59 |
| 7,532,280 B2* | 5/2009 | Yoshida | ........... | G02F 1/133371 |
| | | | | 349/110 |
| 7,645,649 B1* | 1/2010 | Lai | ................... | G02F 1/136209 |
| | | | | 438/149 |
| 7,719,640 B2* | 5/2010 | Yoshida | ........... | G02F 1/133371 |
| | | | | 349/110 |
| 7,817,227 B2* | 10/2010 | Lee | ................. | G02F 1/136209 |
| | | | | 349/106 |
| 9,431,463 B2* | 8/2016 | Choi | .................... | H01L 27/322 |
| 2005/0094061 A1* | 5/2005 | Lee | ................ | G02F 1/133516 |
| | | | | 349/106 |
| 2009/0161047 A1* | 6/2009 | Cho | ................ | G02F 1/133516 |
| | | | | 349/106 |
| 2015/0070615 A1* | 3/2015 | Cai | ...................... | H01L 27/124 |
| | | | | 349/43 |
| 2016/0148950 A1* | 5/2016 | Xu | ................... | G02F 1/136227 |
| | | | | 257/72 |
| 2016/0299376 A1* | 10/2016 | Ishikawa | .......... | G02F 1/133345 |
| 2016/0299379 A1* | 10/2016 | Sun | .................. | G02F 1/133514 |

* cited by examiner

ARRAY SUBSTRATE AND MANUFACTURING METHOD THEREOF

FIELD OF THE INVENTION

The present invention relates to a technological field of liquid crystal displays, and more particularly to an array substrate and a manufacturing method thereof.

BACKGROUND OF THE INVENTION

As shown in FIG. 1, a conventional liquid crystal display panel comprises: a first substrate 10 and a second substrate, wherein the first substrate 10 is, for example, a BOA (BM on Array, BM: black matrix) substrate, and the BOA substrate is made by forming a color filter film and a black matrix on an array substrate. The first substrate 10 comprises: a substrate 11, a first metal layer 12 formed on the substrate 11, which comprises a plurality of gate electrodes; a gate insulation layer 13 partially formed on the first metal layer 12 and used to separate the first metal layer 12 and an active layer 14; the active layer 14 partially formed on the gate insulation layer 13 and used to form a channel; a second metal layer 15 formed on the active layer 14, which comprises a plurality of source electrodes and drain electrodes; a second insulation layer 16 formed on the second metal layer 15 and used to separate the second metal layer 15 and a color resist layer 17; the color resist layer 17 formed on the second insulation layer 16, which comprises a plurality of color film resists (for example, red color films 171, green color films 172, and blue color films 173); a via 18 formed on the color resist layer 17; a black matrix layer formed on the color resist layer 17; and a transparent conductive layer 20 partially formed on the black matrix layer 191.

Because a reason of leveling property, it causes that the film thickness of the black matrix layer 191 on a display area to not be equal to the film thickness of the black matrix layer 192 on a periphery area. Moreover, the film thickness of the black matrix layer 192 on the periphery area is usually thicker, so that the contrast ratio thereof is worse.

When manufacturing the via, usually, first a through hole is drilled in a color resist layer; next a material of the black matrix is coated on the color resist layer having the through hole. Because a reason of leveling property, the thickness of the black matrix inside the through hole is thicker than the thickness of the black matrix which is on the outside of the through hole and formed above the color resist layer. For a later process, it is necessary to remove the black matrix inside the through hole by development. Since the thickness of the black matrix inside the through hole is thicker, the developing time is longer, and also the processing time is longer, so that the production cost is increased.

Hence, it is necessary to provide an array substrate and a manufacturing method thereof which solves the problems existing in the conventional technologies.

SUMMARY OF THE INVENTION

The object of the present invention is to provide an array substrate and a manufacturing method thereof which solves a technical problem existing in the conventional technology in which the thickness of a black matrix is uneven, so that it causes the processing time to be longer, and the contrast ratio to be worse.

For solving the above-mentioned technological problems, the present invention constructs a manufacturing method of an array substrate, comprising steps of:

forming a black matrix layer on a substrate, wherein the black matrix layer comprises a plurality of black matrixes;

forming a first insulation layer on the black matrix layer;

forming a switch array layer on the first insulation layer, wherein the switch array layer comprises a plurality of thin-film transistors;

forming a color resist layer on the switch array layer, wherein the color resist layer comprises a plurality of color resists; each of the color resists has a pervious area therein; an interval between the black matrix layer and a minimum distance edge of the pervious area of the corresponding color resist is at least 2 micrometers, wherein the minimum distance edge is an edge of the corresponding color resist closest to the black matrix layer; and forming a transparent conductive layer on the color resist layer.

In the manufacturing method of the array substrate according to the present invention, the step of forming the switch array layer on the black matrix layer includes steps of:

forming a first metal layer on the black matrix layer and patterning the first metal layer to form a plurality of gate electrodes;

forming an active layer on the first metal layer, wherein the active layer is used to form a channel; and forming a second metal layer on the active layer and patterning the second metal layer to form a plurality of source electrodes and drain electrodes.

In the manufacturing method of the array substrate according to the present invention, at least one via is formed on the color resist layer, so that the transparent conductive layer is connected to the second metal layer through the via.

In the manufacturing method of the array substrate according to the present invention, a second insulation layer is further provided between the switch array layer and the color resist layer.

In the manufacturing method of the array substrate according to the present invention, a third insulation layer is further provided between the color resist layer and the transparent conductive layer.

For solving the above-mentioned technological problems, the present invention constructs a manufacturing method of an array substrate, comprising steps of:

forming a black matrix layer on a substrate, wherein the black matrix layer comprises a plurality of black matrixes;

forming a switch array layer on the black matrix layer, wherein the switch array layer comprises a plurality of thin-film transistors;

forming a color resist layer on the switch array layer, wherein the color resist layer comprises a plurality of color resists; and forming a transparent conductive layer on the color resist layer.

In the manufacturing method of the array substrate according to the present invention, each of the color resists has a pervious area therein; an interval between the black matrix layer and a minimum distance edge of the pervious area of the corresponding color resist is at least 2 micrometers, wherein the minimum distance edge is an edge of the corresponding color resist closest to the black matrix layer.

In the manufacturing method of the array substrate according to the present invention, a first insulation layer is further provided between the black matrix layer and the switch array layer.

In the manufacturing method of the array substrate according to the present invention, the step of forming the switch array layer on the black matrix layer includes steps of:

forming a first metal layer on the black matrix layer and patterning the first metal layer to form a plurality of gate electrodes;

forming an active layer on the first metal layer, wherein the active layer is used to form a channel;

forming a second metal layer on the active layer and patterning the second metal layer to form a plurality of source electrodes and drain electrodes.

In the manufacturing method of the array substrate according to the present invention, at least one via is formed on the color resist layer, so that the transparent conductive layer is connected to the second metal layer through the via.

In the manufacturing method of the array substrate according to the present invention, a second insulation layer is provided between the switch array layer and the color resist layer.

In the manufacturing method of the array substrate according to the present invention, a third insulation layer is provided between the color resist layer and the transparent conductive layer.

The present invention further provides an array substrate, comprising:

a substrate;

a black matrix layer formed on the substrate and comprising a plurality of black matrixes;

a switch array layer formed on the black matrix layer and comprising a plurality of thin-film transistors;

a color resist layer formed on the switch array layer and comprising a plurality of color resists; and a transparent conductive layer formed on the color resist layer.

In the array substrate according to the present invention, each of the color resists has a pervious area therein; an interval between the black matrix layer and a minimum distance edge of the pervious area of the corresponding color resist is at least 2 micrometers, wherein the minimum distance edge is an edge of the corresponding color resist closest to the black matrix layer.

In the array substrate according to the present invention, a first insulation layer is further provided between the black matrix layer and the switch array layer.

In the array substrate according to the present invention, the switch array layer, includes:

a first metal layer formed on the black matrix layer and having a plurality of gate electrodes;

an active layer formed on the first metal layer, and used to form a channel; and a second metal layer formed on the active layer and having a plurality of source electrodes and drain electrodes.

In the array substrate according to the present invention, at least one via is formed on the color resist layer, so that the transparent conductive layer is connected to the second metal layer through the via.

In the array substrate according to the present invention, a second insulation layer is provided between the switch array layer and the color resist layer.

In the array substrate according to the present invention, a third insulation layer is provided between the color resist layer and the transparent conductive layer.

In the array substrate and the manufacturing method thereof according to the present invention, by the black matrix layer being manufactured before the color resist layer, the manufacturing process is reduced, the production cost is lowered, and the display effect is improved.

DETAILED DESCRIPTION OF THE PREFERRED EMBODIMENTS

Figure 1:
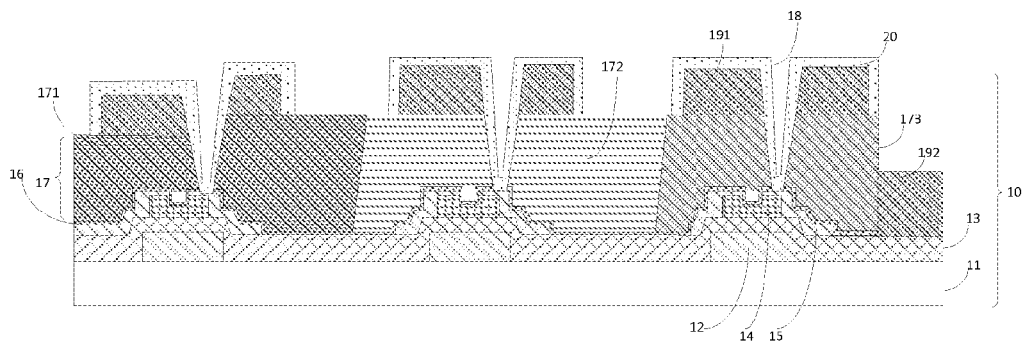
FIG. 1 is a structural schematic view of an array substrate according to a conventional technology.

The foregoing objects, features, and advantages adopted by the present invention can be best understood by referring to the following detailed description of the preferred embodiments and the accompanying drawings. Furthermore, the directional terms described in the present invention, such as upper, lower, front, rear, left, right, inner, outer, side, etc., are only directions with reference to the accompanying drawings, so that the used directional terms are used to describe and understand the present invention, but the present invention is not limited thereto. In the drawings, units with similar structures use the same numerals.

Figure 2:
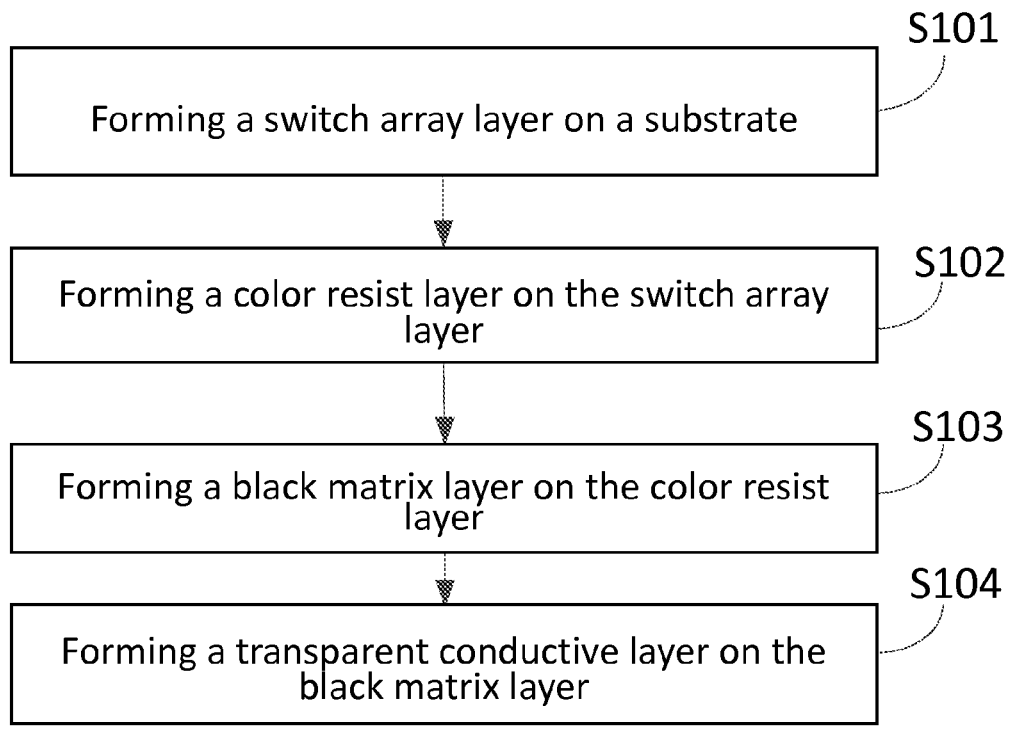
FIG. 2 is a flow chart of a manufacturing method of an array substrate according to a conventional technology.

Refer now to FIG. 2, which is a flow chart of a manufacturing method of an array substrate according to a conventional technology. A manufacturing method of an array substrate according to the conventional technology comprises following steps of:

S101: forming a switch array layer on a substrate.

The switch array layer comprises a plurality of thin-film transistors.

A specific manufacturing method of the switch array layer is:

S111: forming a first metal layer on the substrate and patterning the first metal layer to form a plurality of gate electrodes.

In the step S111, specifically, the first metal layer is exposed, developed, and etched to form the gate electrodes by a mask with patterns, and the other part of the first metal layer excluding the gate electrodes is etched in the process. The material of the metal layer can be chromium, molybdenum, aluminum, or copper.

S112: forming an active layer on the first metal layer, wherein the active layer is used to form a channel between a source electrode and a drain electrode.

S113: forming a second metal layer on the active layer.

The second metal layer is patterned to form a plurality of source electrodes and drain electrodes, wherein the number of the gate electrodes is matched with the number of the source electrodes and drain electrodes.

S102: forming a color resist layer on the switch array layer.

The color resist layer is further provided with at least one via therein, so that a transparent conductive layer is connected to the second metal layer through the via.

S103: forming a black matrix layer on the color resist layer.

The black matrix layer comprises a plurality of black matrixes. After Step S102, a material of the black matrix is coated on the color resist layer having the via. Because a reason of leveling property, the thickness of the black matrix inside the via is thicker than the thickness of the black matrix which is outside of the via and formed above the color resist layer. For a later process, it is necessary to remove the black matrix inside the via by development. Since the thickness of the black matrix inside the via is thicker, the developing time is longer, and also the processing time is longer, so that the production cost is increased.

S104: forming a transparent conductive layer on the black matrix layer.

A sputter coating method can be used to form the transparent conductive layer on the black matrix layer.

Figure 3:
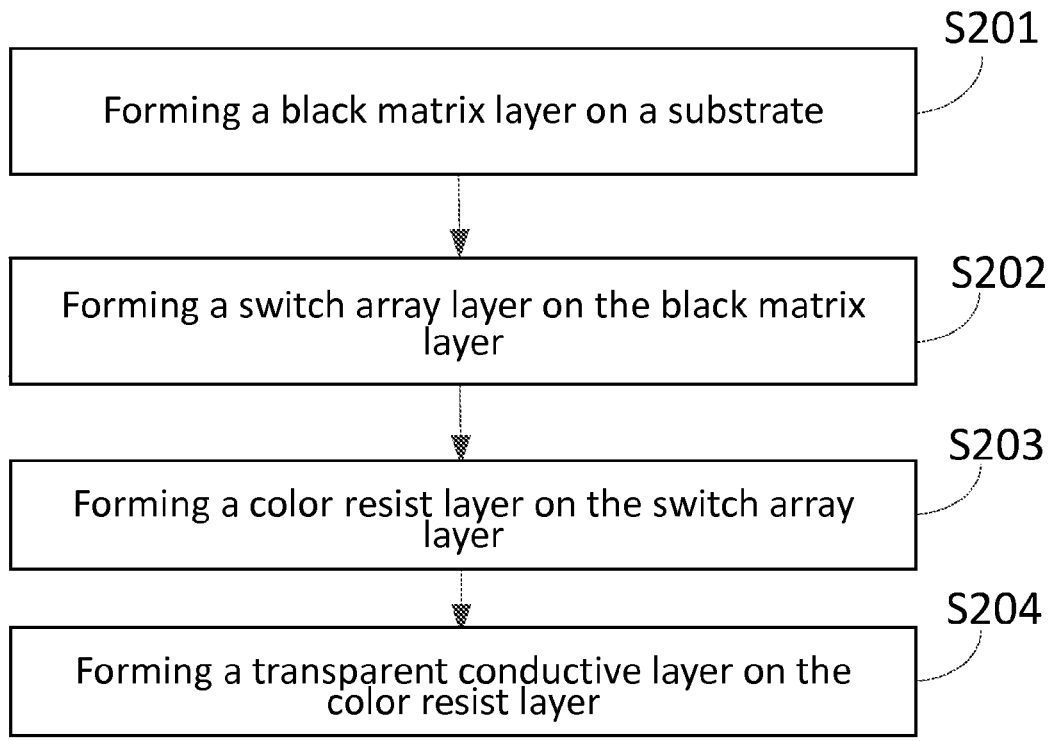
FIG. 3 is a flow chart of a manufacturing method of an array substrate according to the present invention.

Refer now to FIG. 3, which is a flow chart of a manufacturing method of an array substrate according to the present invention.

A manufacturing method of an array substrate according to the present invention comprises following steps of:

S201: forming a black matrix layer on a substrate.

The black matrix layer comprises a plurality of black matrixes. A material of the black matrix is coated on the substrate, and the material of the black matrix is exposed and developed to form the black matrixes by a mask with patterns.

S202: forming a switch array layer on the black matrix layer.

The switch array layer comprises a plurality of thin-film transistors. The step 202 comprises:

S221: forming a first metal layer on the black matrix layer and patterning the first metal layer to form a plurality of gate electrodes.

In the step S221, specifically, the first metal layer is exposed, developed, and etched to form the gate electrodes by a mask with patterns, and the other part of the first metal layer excluding the gate electrodes is etched in the process. The material of the metal layer can be chromium, molybdenum, aluminum, or copper.

S222: forming an active layer on the first metal layer, wherein the active layer is used to form a channel.

The active layer is used to form the channel between a drain electrode and a source electrodes. The material of the active layer is such as an amorphous silicon. The active layer is formed on an exposed gate insulation layer.

Preferably, before manufacturing the active layer, the method further comprises:

A gate insulation layer is formed on the gate electrodes and the substrate which is uncovered by the gate electrodes.

S222: forming a second metal layer on the active layer and patterning the second metal layer to form a plurality of source electrodes and drain electrodes.

In the step S22, specifically, the second metal layer is exposed, developed, and etched to form the source electrodes and the drain electrodes by a mask with patterns, and the other part of the second metal layer excluding the source electrodes and the drain electrodes is etched in the process.

S203: forming a color resist layer on the switch array layer.

The color resist layer comprises a plurality of color film resists, for example red color films, green color films, and blue color films. At least one via is formed in the color resist layer, so that a transparent conductive layer is connected to the second metal layer through the via.

S204: forming the transparent conductive layer on the color resist layer.

A sputter coating method can be used to form the transparent conductive layer on the color resist layer having the via. The transparent conductive layer comprises a plurality of pixel electrodes.

Because the black matrix layer is manufactured before the color resist layer, the process of the conventional technology, which must develop the black matrix inside the via for a long developing time, is omitted, which can reduce the manufacturing time, and lower the production cost. Additionally, because the black matrix layer is directly manufactured on the substrate, the thicknesses of the black matrix in a display area and a non-display area are easily controlled, so as to increase the contrast ratio.

The method further comprises:

S205: a first insulation layer is further provided between the black matrix layer and the switch array layer.

Because the material character will be changed between manufacturing processes, by providing the first insulation layer between the black matrix layer and the switch array layer, it can avoid influencing the stability of the switch array layer.

S206: a second insulation layer is provided between the switch array layer and the color resist layer.

The second insulation layer is used for separating the second metal layer and the color resist layer, so as to prevent the second metal layer from oxidization.

S207: a third insulation layer is provided between the color resist layer and the transparent conductive layer.

The third insulation layer is used for planarization of the surface of the color resist layer which is advantageous in evening the thickness of the transparent conductive layer, and the electric field between the two substrates can be more even, so as to improve the display effect.

Preferably, each of the color resists has a pervious area therein, wherein an interval between the black matrix layer and a minimum distance edge of the pervious area of the corresponding color resist is at least 2 micrometers, wherein the minimum distance edge is the closest edge to the black matrix layer.

Figure 5:
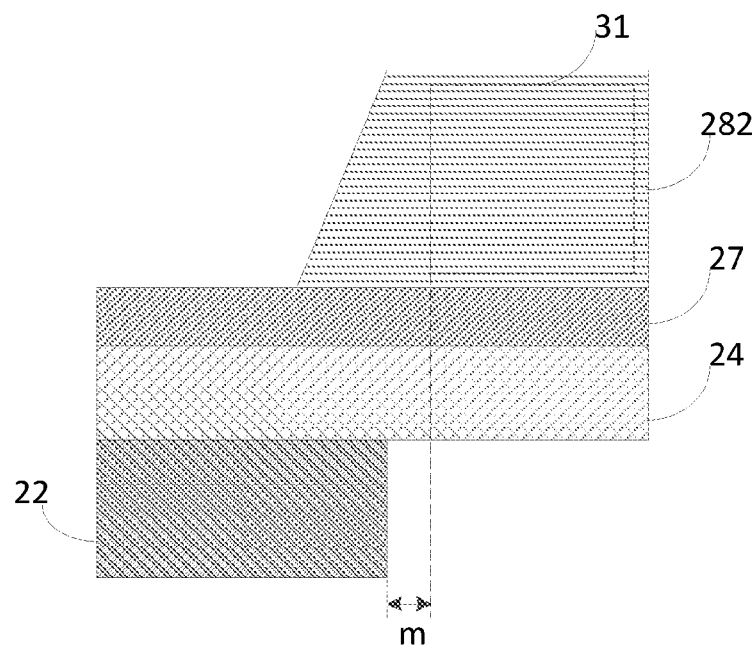
FIG. 5 is a partial enlarged schematic view of an area A of FIG. 4.
Figure 6:
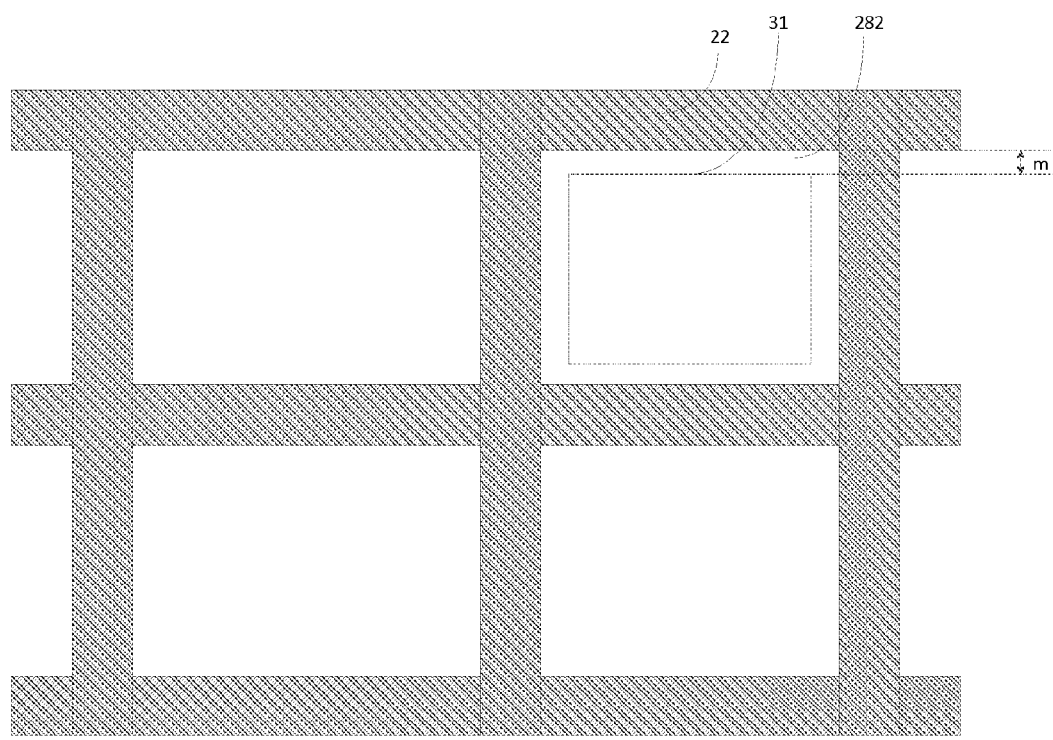
FIG. 6 is a top view of a black matrix according to the present invention.

The array substrate comprises a plurality of data lines and scan lines, and a plurality of pixel units defined by the data lines and scan lines. Each of the pixel units comprises red pixel (composed by red color films), green pixel (composed by green color films), and blue pixel (composed by blue color films). The pervious area and the pixel are used for corresponding to a display area. Generally, the pervious area is a quadrangle. An interval between the black matrix corresponding to the color resists and the minimum distance edge of the pervious area is at least 2 micrometers, wherein the minimum distance edge is the closest edge to the black matrix layer. As shown in FIGS. 5 and 6, the color film resist 282 has a pervious area 31, and an interval between the black matrix 22 and the minimum distance edge of the pervious area 31 is m, wherein m is greater than or equal to 2 micrometers.

Because the black matrix layer is formed on the array substrate, the surface of the substrate is uneven. If the interval between the black matrix and the minimum distance edge of the pervious area is too small, the slanting direction of liquid crystal molecules in the edges of the pervious area are disturbed, the pervious ratio is influenced, dark fringes are produced, and the display effect is lowered. By increasing the above-mentioned interval, it can eliminate the phenomenon of dark fringes caused by the uneven surface of the substrate, so as to improve the display effect.

Figure 4:
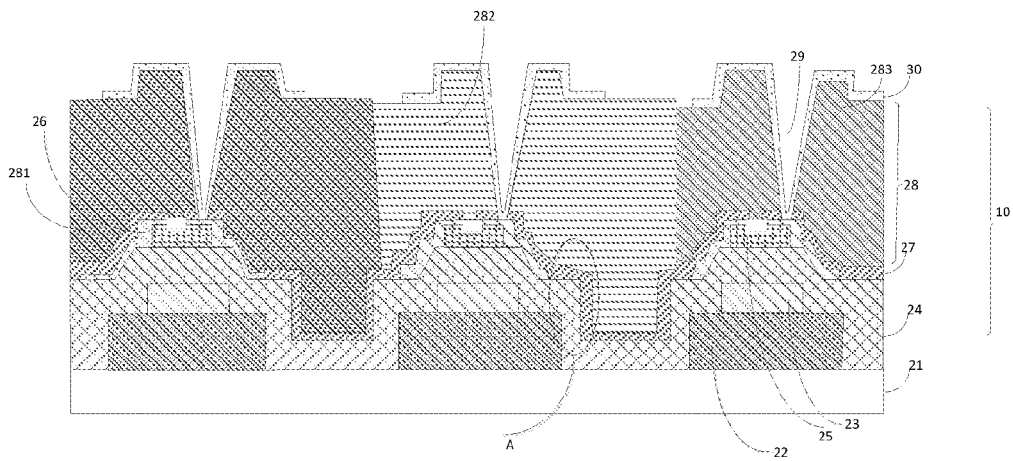
FIG. 4 is a structural schematic view of an array substrate according to the present invention.

As shown in FIG. 4, a liquid crystal display panel according to the present invention comprises: a first substrate 21, a second substrate, and a liquid crystal layer formed between the first substrate 10 and the second substrate, wherein the second substrate comprises a substrate and common electrodes. The first substrate 10 is, for example, a BOA (BM on Array, BM: black matrix) substrate. The first substrate 10 comprises: another substrate 21, a black matrix layer 22, a switch array layer 23-27, a color resist layer 28, and a transparent conductive layer 30.

The black matrix layer 22 is formed on the substrate 21, and the black matrix layer comprises a plurality of black matrixes; and the switch array layer 23-27 is formed on the black matrix layer 22, and the switch array layer comprises a plurality of thin-film transistors.

The color resist layer 28 is formed on the switch array layer, and the color resist layer comprises a plurality of color resists; and the transparent conductive layer 30 is formed on the color resist layer.

The switch array layer comprises:

A first metal layer 23 formed on the black matrix layer 22 and comprising a plurality of gate electrodes; a gate insulation layer 24 partially formed on the first metal layer 12 and used for separating the first metal layer 23 and an active layer 25; the active layer 25 partially formed on the gate insulation layer 13 and used for forming a channel; a second metal layer 26 formed on the active layer 25 and comprising a plurality of source electrodes and drain electrodes; the color resist layer 28 is provided with at least a via 29 therein; and the transparent conductive layer 30 is connected to the second metal layer 26 through the via 29.

Preferably, a first insulation layer is further provided between the black matrix layer 22 and the first metal layer 23.

Preferably, a second insulation layer 27 is provided between the second metal layer 26 and the color resist layer 28.

Preferably, the second insulation layer 27 is used to separate the second metal layer 26 and the color resist layer 28. A third insulation layer is provided between the color resist layer 28 and the transparent conductive layer 30.

Preferably, as shown in FIGS. 5 and 6, the color film resist 282 has a pervious area 31, and the interval between the black matrix 22 and the minimum distance edge of the pervious area of the corresponding color resist is at least 2 micrometers, wherein the minimum distance edge is the closest edge to the black matrix layer, for example the top edge in FIG. 6.

In the array substrate and the manufacturing method thereof according to the present invention, by the black matrix layer being manufactured before the color resist layer, the manufacturing process can be reduced, the production cost can be lowered, and the display effect can be improved.

The present invention has been described with preferred embodiments thereof and it is understood that many changes and modifications to the described embodiment can be carried out without departing from the scope and the spirit of the invention that is intended to be limited only by the appended claims.

The invention claimed is:

1. A manufacturing method of an array substrate, comprising steps of:
   forming a black matrix layer on a substrate, wherein the black matrix layer comprises a plurality of black matrixes;
   forming a first insulation layer on the black matrix layer;
   forming a switch array layer on the first insulation layer, wherein the switch array layer comprises a plurality of thin-film transistors;
   forming a color resist layer on the switch array layer, wherein the color resist layer comprises a plurality of color resists; each of the color resists has a pervious area which is a color display area of a colored pixel with edges of the pixel's display area being optically discernable by being arranged in an end-product display wherein the display area is pervious to light through the color resist in that area in operation; and an interval between the black matrix layer and a minimum distance edge of the pervious area of the corresponding color resist is at least 2 micrometers, wherein the minimum distance edge is an edge of the corresponding color resist closest to the black matrix layer; and
   forming a transparent conductive layer on the color resist layer.

2. The manufacturing method of the array substrate according to claim 1, wherein the step of forming the switch array layer on the first insulation layer on the black matrix layer includes steps of:
   forming a first metal layer on the black matrix layer and patterning the first metal layer to form a plurality of gate electrodes;
   forming an active layer on the first metal layer, wherein the active layer is used to form a channel; and
   forming a second metal layer on the active layer and patterning the second metal layer to form a plurality of source electrodes and drain electrodes.

3. The manufacturing method of the array substrate according to claim 2, wherein at least one via is formed in the color resist layer, so that the transparent conductive layer is connected to the second metal layer through the via.

4. The manufacturing method of the array substrate according to claim 1, wherein a second insulation layer is further provided between the switch array layer and the color resist layer.

5. The manufacturing method of the array substrate according to claim 1, wherein a third insulation layer is further provided between the color resist layer and the transparent conductive layer.

6. A manufacturing method of an array substrate, comprising steps of:
   forming a black matrix layer on a substrate, wherein the black matrix layer comprises a plurality of black matrixes;
   forming a switch array layer on the black matrix layer, wherein the switch array layer comprises a plurality of thin-film transistors;
   forming a color resist layer on the switch array layer, wherein the color resist layer comprises a plurality of color resists; and
   forming a transparent conductive layer on the color resist layer;
   wherein each of the color resists has a pervious area which is a color display area of a colored pixel with edges of the pixel's display area being optically discernable by being arranged in an end-product display wherein the display area is pervious to light through the color resist in that area in operation; and
   an interval between the black matrix layer and a minimum distance edge of the pervious area of the corresponding color resist is at least 2 micrometers, wherein the minimum distance edge is an edge of the corresponding color resist closest to the black matrix layer.

7. The manufacturing method of the array substrate according to claim 6, wherein a first insulation layer is further provided between the black matrix layer and the switch array layer.

8. The manufacturing method of the array substrate according to claim 6, wherein the step of forming the switch array layer on the black matrix layer includes steps of:
 forming a first metal layer on the black matrix layer and patterning the first metal layer to form a plurality of gate electrodes;
 forming an active layer on the first metal layer, wherein the active layer is used to form a channel; and
 forming a second metal layer on the active layer and patterning the second metal layer to form a plurality of source electrodes and drain electrodes.

9. The manufacturing method of the array substrate according to claim 8, wherein at least one via is formed on the color resist layer, so that the transparent conductive layer is connected to the second metal layer through the via.

10. The manufacturing method of the array substrate according to claim 6, wherein a second insulation layer is provided between the switch array layer and the color resist layer.

11. The manufacturing method of the array substrate according to claim 6, wherein a third insulation layer is provided between the color resist layer and the transparent conductive layer.

12. An array substrate, comprising:
 a substrate;
 a black matrix layer formed on the substrate and comprising a plurality of black matrixes;
 a switch array layer formed on the black matrix layer and comprising a plurality of thin-film transistors;
 a color resist layer formed on the switch array layer and comprising a plurality of color resists; and
 a transparent conductive layer formed on the color resist layer;
 wherein each of the color resists has a pervious area which is a color display area of a colored pixel with edges of the pixel's display area being optically discernable by being arranged in an end-product display wherein the display area is pervious to light through the color resist in that area in operation; and
 an interval between the black matrix layer and a minimum distance edge of the pervious area of the corresponding color resist is at least 2 micrometers, wherein the minimum distance edge is an edge of the corresponding color resist closest to the black matrix layer.

13. The array substrate according to claim 12, wherein a first insulation layer is further provided between the black matrix layer and the switch array layer.

14. The array substrate according to claim 12, wherein the switch array layer includes:
 a first metal layer formed on the black matrix layer and having a plurality of gate electrodes;
 an active layer formed on the first metal layer, and used to form a channel; and
 a second metal layer formed on the active layer and having a plurality of source electrodes and drain electrodes.

15. The array substrate according to claim 14, wherein at least one via is formed on the color resist layer, so that the transparent conductive layer is connected to the second metal layer through the via.

16. The array substrate according to claim 12, wherein a second insulation layer is provided between the switch array layer and the color resist layer.

17. The array substrate according to claim 12, wherein a third insulation layer is provided between the color resist layer and the transparent conductive layer.

* * * * *